US011539905B2

(12) United States Patent
Yang et al.

(10) Patent No.: US 11,539,905 B2
(45) Date of Patent: Dec. 27, 2022

(54) IMAGE SENSING DEVICE INCLUDING CONVERSION GAIN CAPACITOR

(71) Applicant: SK hynix Inc., Icheon-si (KR)

(72) Inventors: Dong Joo Yang, Icheon-si (KR); Seung Hoon Sa, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/354,252

(22) Filed: Jun. 22, 2021

(65) Prior Publication Data
US 2022/0321822 A1 Oct. 6, 2022

(30) Foreign Application Priority Data
Mar. 31, 2021 (KR) ........................ 10-2021-0041571

(51) Int. Cl.
H04N 5/3745 (2011.01)
H01L 27/146 (2006.01)
H04N 5/351 (2011.01)

(52) U.S. Cl.
CPC ..... H04N 5/3745 (2013.01); H01L 27/14603 (2013.01); H01L 27/14609 (2013.01); H01L 27/14641 (2013.01); H04N 5/351 (2013.01)

(58) Field of Classification Search
CPC ........................... H04N 5/3745; H04N 5/351; H01L 27/14603; H01L 27/14609; H01L 27/14641
See application file for complete search history.

(56) References Cited

U.S. PATENT DOCUMENTS 9,247,170 B2 1/2016 Komori et al.
10,510,796 B1* 12/2019 Wang ................ H01L 27/14636
11,310,447 B2* 4/2022 Yun ...................... H04N 5/3559

* cited by examiner

Primary Examiner — Ahmed A Berhan
(74) Attorney, Agent, or Firm — Perkins Coie LLP

(57) ABSTRACT

Image sensing devices are disclosed. An image sensing device includes a first pixel group including a plurality of first image sensing pixels to convert light into electrical charges and a first conversion gain transistor coupled to the plurality of first image sensing pixels, a second pixel group including a plurality of second image sensing pixels to convert light into electrical charges and a second conversion gain transistor coupled to the plurality of second image sensing pixels, the second pixel group disposed adjacent to the first pixel group, and a conversion gain capacitor to electrically couple the first conversion gain transistor to the second conversion gain transistor to provide a capacitance to the first and second image sensing pixels. The conversion gain capacitor comprises a first conductive line to include a region having a ring type shape and a second conductive line disposed adjacent to the first conductive line.

26 Claims, 8 Drawing Sheets

IMAGE SENSING DEVICE INCLUDING CONVERSION GAIN CAPACITOR

CROSS-REFERENCES TO RELATED APPLICATION

This patent document claims the priority and benefits of Korean patent application number 10-2021-0041571, filed on Mar. 31, 2021, which is incorporated herein by reference in its entirety.

TECHNICAL FIELD

The embodiments of the disclosed technology relate to an image sensing device.

BACKGROUND

An image sensing device is a device for converting an optical image into an electrical signal. As the computer and communication industries are recently advanced, a demand for an image sensing device having improved performance is increasing in fields, such as a smartphone, a digital camera, a camcorder, a personal communication system (PCS), a game machine, a camera for security, a medical micro camera, a robot industry and an infrared sensing device.

CMOS image sensing device has advantages in that the sensing device can be easily reduced in size because it can be driven in a simple way and integrated in a single chip and that the sensing device has very low consumption power due to a high degree of integration thereof. Furthermore, the CMOS image sensing device is recently widely used because it can be fabricated using the CMOS process technology and has a low manufacturing unit cost.

SUMMARY

The disclosed technology can be implemented in some embodiments to provide an image sensing device adjusting the sensitivity of image sensor pixels.

In some implementations, an image sensing device may include a first pixel group including a plurality of first image sensing pixels structured to convert light into electrical charges and a first conversion gain transistor coupled to the plurality of first image sensing pixels, a second pixel group including a plurality of second image sensing pixels structured to convert light into electrical charges and a second conversion gain transistor coupled to the plurality of second image sensing pixels, the second pixel group disposed adjacent to the first pixel group, and a conversion gain capacitor structured to electrically couple the first conversion gain transistor to the second conversion gain transistor to provide a capacitance to the first and second image sensing pixels. The conversion gain capacitor comprises a first conductive line structured to include a region having a ring type shape and a second conductive line disposed adjacent to the first conductive line.

In some implementations, an image sensing device may include a first pixel group including a plurality of first image sensing pixels structured to convert light into electrical charges and a first conversion gain transistor coupled to the plurality of first image sensing pixels, a second pixel group including a plurality of second image sensing pixels structured to convert light into electrical charges and a second conversion gain transistor disposed adjacent to and coupled to the plurality of second image sensing pixels, the second pixel group aligned with the first pixel group in a second direction, a conversion gain capacitor disposed on one side of the first pixel group and the second pixel group in a first direction intersecting the second direction and structured to electrically couple the first conversion gain transistor to the second conversion gain transistor to provide a capacitance to the first and second image sensing pixels. The conversion gain capacitor comprises a first conductive line structured to electrically couple the first conversion gain transistor to the second conversion gain transistor and include a first region having a rectangle type shape that is closed and a second region having a rectangle type shape that includes an open portion at one end thereof, and a second conductive line formed within the first region of the first conductive line.

In some implementations, an image sensing device may include a first pixel group including a plurality of first image sensing pixels structured to convert light into electrical charges and a first conversion gain transistor coupled to the plurality of first image sensing pixels, a second pixel group including a plurality of second image sensing pixels structured to convert light into electrical charges and a second conversion gain transistor disposed adjacent to and coupled to the plurality of second image sensing pixels, the second pixel group aligned with the first pixel group in a first direction, and a conversion gain capacitor disposed between the first pixel group and the second pixel group in the first direction and structured to electrically couple the first conversion gain transistor to the second conversion gain transistor to provide a capacitance to the first and second image sensing pixels. The conversion gain capacitor comprises a first conductive line structured to extend in a second direction intersecting the first direction and electrically coupled to the first conversion gain transistor and the second conversion gain transistor, the first conductive line comprising a first region having a ring type plane shape and a second region having a line type plane shape, and second conductive lines elongated in the second direction and disposed on both sides of the first conductive line.

In some implementations, an image sensing device may include a first pixel group including a first conversion gain transistor, a second pixel group disposed adjacent to the first pixel group and including a second conversion gain transistor, and a conversion gain capacitor suitable for electrically coupling the first conversion gain transistor and the second conversion gain transistor. In this case, the conversion gain capacitor may include a first conductive line including a region having a ring type plane shape and a second conductive line disposed adjacent to the first conductive line.

In some implementations, an image sensing device may include a first pixel group including a first conversion gain transistor, a second pixel group aligned with the first pixel group in a second direction and including a second conversion gain transistor, and a conversion gain capacitor disposed on one side of the first pixel group and the second pixel group in a first direction intersecting the second direction and suitable for electrically coupling the first conversion gain transistor and the second conversion gain transistor. In this case, the conversion gain capacitor may include a first conductive line suitable for electrically coupling the first conversion gain transistor and the second conversion gain transistor and including a first region having a ring type plane shape and a second region having a bracket type plane shape including an open part having one side opened, and a second conductive line formed within the first region of the first conductive line.

In some implementations, an image sensing device may include a first pixel group including a first conversion gain transistor, a second pixel group aligned with the first pixel group in a first direction and including a second conversion gain transistor, and a conversion gain capacitor disposed between the first pixel group and the second pixel group in the first direction and suitable for electrically coupling the first conversion gain transistor and the second conversion gain transistor. In this case, the conversion gain capacitor may include a first conductive line elongated in a second direction intersecting the first direction, electrically coupled to the first conversion gain transistor and the second conversion gain transistor, and including a first region having a ring type plane shape and a second region having a line type plane shape, and second conductive lines elongated in the second direction and disposed on both sides of the first conductive line.

The disclosed technology can easily adjust the sensitivity of an image sensor by including the conversion gain capacitor for electrically coupling the first conversion gain transistor of the first pixel group and the second conversion gain transistor of the second pixel group.

DETAILED DESCRIPTION

Advantages and characteristics of the disclosed technology and methods of achieving the advantages and characteristics will be discussed below with reference to the accompanying drawings.

The following present technology is for providing an image sensing device capable of adjusting sensitivity. More specifically, the disclosed technology is for providing an image sensing device capable of obtaining an image having high quality in a high illumination environment and a low illumination environment by maximizing a conversion gain ratio.

For reference, the following embodiments of the disclosed technology will be described by taking, as an example, a case where the technical spirit of the disclosed technology is applied to a structure in which one pixel group includes eight unit pixels (i.e., an 8-shared pixel structure). The technical spirit of the disclosed technology may be identically applied to a structure in which one pixel group includes four unit pixels (i.e., a 4-shared pixel structure) or includes two unit pixels (i.e., a 2-shared pixel structure).

Furthermore, the technical spirit of the disclosed technology may also be applied to an image sensor not having a shared pixel structure.

In the following description, a first direction D1 and a second direction D2 may denote intersecting directions. For example, in the XY coordinate system, the first direction D1 may be an X-axis direction, and the second direction D2 may be a Y-axis direction.

Figure 1:
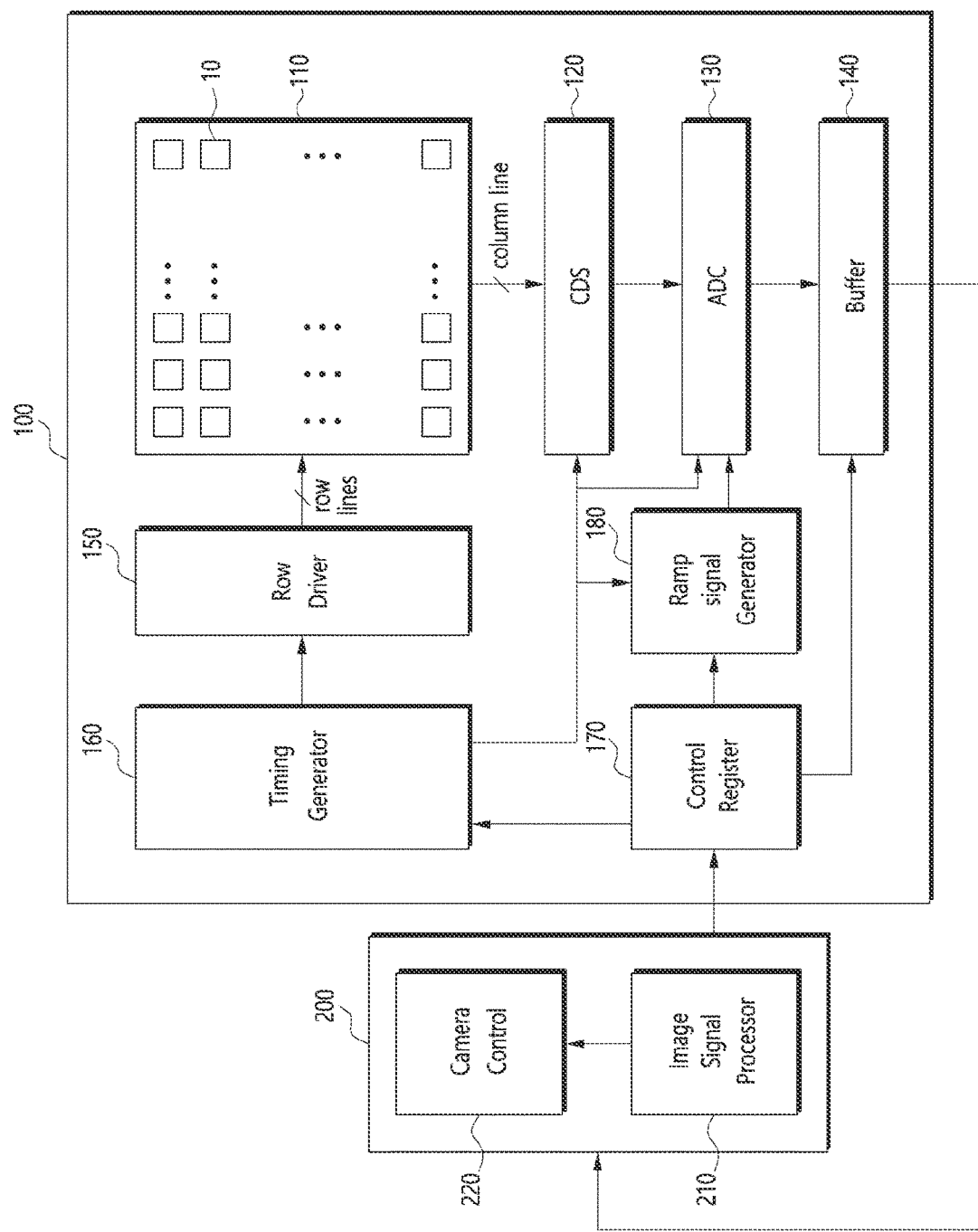
FIG. 1 illustrates an example configuration of an image sensing device based on some embodiments of the disclosed technology.

FIG. 1 illustrates an example configuration of an image sensing device based on some embodiments of the disclosed technology.

As illustrated in FIG. 1, the image sensing device 100 based on some embodiments may include a pixel array 110 in which a plurality of pixels is arranged as a matrix structure, a correlated double sampler (CDS) 120, an analog-digital converter (ADC) 130, a buffer 140, a row driver 150, a timing generator 160, a control register 170, and a ramp signal generator 180. The elements of the image sensing device 100 illustrated in FIG. 1 are for illustration and not limitation. In other implementations, the elements of the image sensing device 100 may be combined with additional elements or some of the elements may be omitted.

The image sensing device 100 may include an optical lens or assembly of lenses used in conjunction with the image sensing device 100 to cause light corresponding to an image of an object to converge under the control of an image processor 200. The image processor 200 may transmit electrical signals corresponding to the image, sensed and outputted by the image sensing device 100, to an electronic apparatus including a display, etc.

The image processor 200 may include a camera controller 220, an image signal processor 210, and an interface device (e.g., PC interface (I/F), not illustrated). The camera controller 220 may control the control register 170. In some implementations, the camera controller 220 may control the control register 170 of the image sensing device 100 by using an interface or communication bus such as an inter-integrated circuit (I2C). The image signal processor 220 may receive image information such as an output signal of the buffer 140. and process the image for viewing on a display device.

The pixel array 110 may include a plurality of pixel groups 10 arranged in a matrix array. Each of the plurality of pixel groups 10 may be structured to convert optical image information into electrical image signals and transmit the electrical image signals to the CDS 120. The pixel array 110 includes a plurality of photo-converter devices such as photodiode or photodetector to detect and convert incident light into electrical signals.

The CDS 120 may hold and sample an electrical image signal received from pixels of the pixel array 110. For example, the CDS 120 may sample a reference voltage level and a voltage level of a received electrical image signal in response to a clock signal provided by the timing generator 160, and may transmit, to the ADC 130, analog signals corresponding to a difference between the reference voltage level and the voltage level.

The ADC 130 may convert the analog signals into digital signals and transmit the digital signals to the buffer 140.

The buffer 140 may hold or latch the digital signals and sequentially output the latched signals to the image signal processor. The buffer 140 may include a memory device for holding or latching digital signals and a sense amplifier for amplifying the digital signals.

The row driver 150 may activate a plurality of pixels of the pixel array 110 to detect or convert the incident light in response to a control or clock signal of the timing generator 160. For example, the row driver 150 may generate selection signals for selecting at least one of a plurality of row lines and/or generate driving signals for performing operations associated with the one row line.

The timing generator 160 may generate timing signals for controlling the CDS 120, the ADC 130, the row driver 150, and the ramp signal generator 180.

The control register 170 may generate control signals for controlling the buffer 140, the timing generator 160, and the ramp signal generator 180. The buffer 140, the timing generator 160, and the ramp signal generator 180 may perform associated operations in response to the control signals. In some implementations, the control register 170 may operate under the control of the camera controller.

The ramp signal generator 180 may generate a ramp signal for processing an image signal under the control of the timing generator 160.

Figure 2:
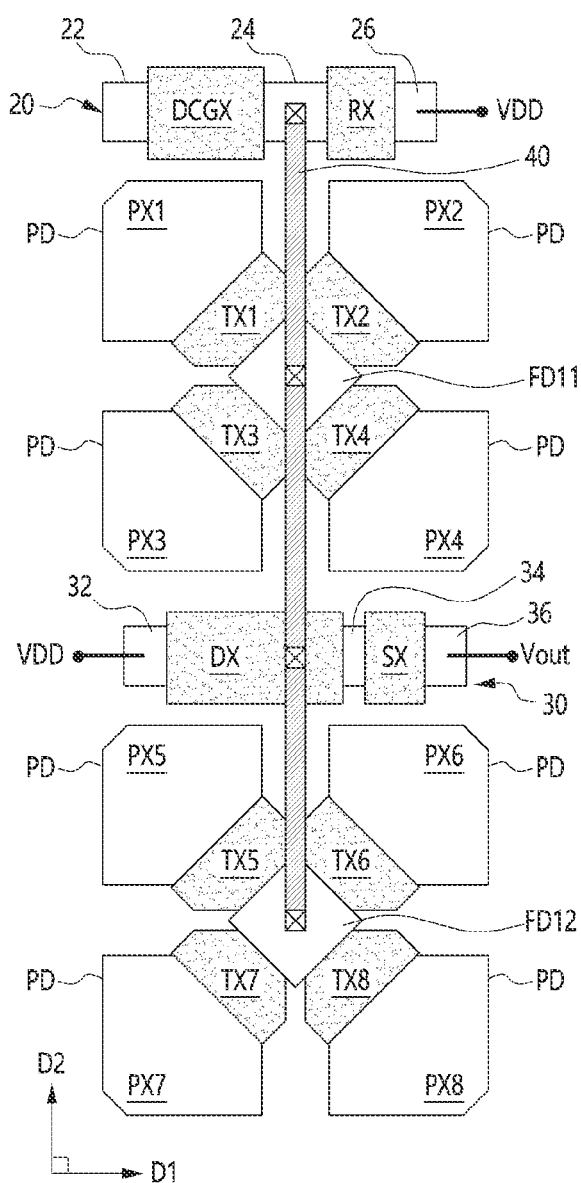
FIG. 2 illustrates an example of a pixel group of the image sensing device based on some embodiments of the disclosed technology.

FIG. 2 illustrates an example of a pixel group of the image sensing device based on some embodiments of the disclosed technology.

As illustrated in FIG. 2, the pixel array 110 (refer to FIG. 1) of the image sensing device of based on some embodiments may include a plurality of pixel groups 10 arranged in a matrix array. Each of the plurality of pixel groups 10 may include a plurality of unit pixels structured to convert light into electrical currents. In one example, a pixel group 10 may include a first unit pixel PX1 to an eighth unit pixel PX8 arranged in a 2×4 matrix array as illustrated in FIG. 2. In this case, the first unit pixel PX1 to the fourth unit pixel PX4 may share a first sub-floating diffusion FD11 and disposed to surround the first sub-floating diffusion FD11. Likewise, the fifth unit pixel PX5 to the eighth unit pixel PX8 may share a second sub-floating diffusion FD12 and disposed to surround the second sub-floating diffusion FD12. The first sub-floating diffusion FD11 and the second sub-floating diffusion FD12 may be aligned with each other in the second direction D2. The first sub-floating diffusion FD11 and the second sub-floating diffusion FD12 may be electrically coupled through a conductive line 40. The conductive line 40 may include an interconnect wiring layer formed on the gates of pixel transistors, and may be electrically coupled to other layers through a contact plug.

Each of the first unit pixel PX1 to the eighth unit pixel PX8 may include photo-converter devices such as photodiodes (PD). The photo-converter devices PD may generate electrical charge carriers corresponding to incident light. The photo-converter devices PD may include photodiodes, phototransistors, photogates, pinned photodiodes (PPD), or a combination thereof. In one example, the photodiode may include an N type impurity region and a P type impurity region that are vertically stacked.

The first unit pixel PX1 to the eighth unit pixel PX8 may include a first transmission transistor TX1 to an eighth transmission transistor TX8, respectively, to transfer electrical charges generated by photo-converter devices in the first unit pixel PX1 to the eighth unit pixel PX8 to the first sub-floating diffusion FD11 and the second sub-floating diffusion FD12, respective, through the first transmission transistor TX1 to the eighth transmission transistor TX8. To this end, a transmission signal may be applied to the gate of each of the first transmission transistor TX1 to the eighth transmission transistor TX8, which transmit electrical charges generated by the photo-converter devices to the first sub-floating diffusion FD11 and the second sub-floating diffusion FD12 in response to the transmission signals.

A conversion gain transistor DCGX and a reset transistor RX may be disposed on one side of the pixel group 10. Specifically, the conversion gain transistor DCGX and the reset transistor RX may be disposed at the upper end of the pixel group 10 in the second direction D2. For example, the conversion gain transistor DCGX may be located adjacent to the first unit pixel PX1, and the reset transistor RX may be located adjacent to the second unit pixel PX2. As another example, the conversion gain transistor DCGX may be located adjacent to the second unit pixel PX2, and the reset transistor RX may be located adjacent to the first unit pixel PX1.

The conversion gain transistor DCGX may increase or decrease the capacitance of the first sub-floating diffusion FD11 and the second sub-floating diffusion FD12 in response to a conversion gain signal applied to the gate of the conversion gain transistor DCGX. The reset transistor RX may reset the first sub-floating diffusion FD11 and the second sub-floating diffusion FD12 in response to a reset signal applied to the gate of the reset transistor RX. The conversion gain transistor DCGX and the reset transistor RX may share a first active region 20. The first active region 20 may extend in the first direction D1. Although not illustrated in the drawings, a well tap may be disposed adjacent to one end of the first active region 20 or both ends of the first active region 20.

The first active region 20 may include a plurality of junction regions. The junction regions may be used as impurity regions such as source and drain electrodes of each of the conversion gain transistor DCGX and the reset transistor RX. For example, a first junction region 22 may be used as an impurity region of the conversion gain transistor DCGX, and a third junction region 26 may be used as an impurity region of the reset transistor RX. A second junction region 24 may be used as impurity regions of the conversion gain transistor DCGX and the reset transistor RX. An impurity region of the conversion gain transistor DCGX may be electrically coupled (e.g., as show in FIG. 3) to an impurity region of a conversion gain transistor DCGX of another adjacent pixel group 10. An impurity region of the reset transistor RX may be electrically coupled to an electrode that is coupled to a power supply voltage node VDD. Furthermore, an impurity region of the conversion gain transistor DCGX and an impurity region of the reset transistor RX may be electrically coupled to the first sub-floating diffusion FD11 and the second sub-floating diffusion FD12 through the conductive line 40.

A driving transistor DX and a selection transistor SX may be disposed between a sub array of the first unit pixel PX1 to the fourth unit pixel PX4 and a sub array of the fifth unit pixel PX5 to the eighth unit pixel PX8. In one example, the driving transistor DX and the selection transistor SX may be disposed in the middle part of the pixel group 10. Here, the driving transistor DX may be used as a source follower transistor. For example, the driving transistor DX may be disposed between the third unit pixel PX3 and the fifth unit pixel PX5, and the selection transistor SX may be disposed between the fourth unit pixel PX4 and the sixth unit pixel PX6. As another example, the driving transistor DX may be disposed between the fourth unit pixel PX4 and the sixth unit pixel PX6, and the selection transistor SX may be disposed between the third unit pixel PX3 and the fifth unit pixel PX5.

The driving transistor DX may have a gate electrode that is electrically coupled to the first sub-floating diffusion FD11 and the second sub-floating diffusion FD12, and may generate an output signal Vout corresponding to the amount of electrical charges that are generated by the photo-converter devices and stored in the first sub-floating diffusion FD11 and the second sub-floating diffusion FD12. The selection transistor SX may transmit the output signal Vout to a column line (e.g., column line illustrated in FIG. 1) in response to a selection signal applied to the gate of the selection transistor SX. The driving transistor DX and the selection transistor SX may share a second active region 30. The second active region 30 may extend in the first direction D1. Although not illustrated in the drawings, a well tap may be disposed adjacent to either side of the second active region 30 or an end on one side/the other side of the second active region 30.

The second active region 30 may include a plurality of junction regions. The junction regions may be used as impurity regions such as source and drain electrodes of each of the driving transistor DX and the selection transistor SX. For example, a fourth junction region 32 may be used as an impurity region of the driving transistor DX, and a sixth junction region 36 may be used as an impurity region of the selection transistor SX. A fifth junction region 34 may be used as an impurity region of the driving transistor DX and an impurity region of the selection transistor SX. Another impurity region of the driving transistor DX may be electrically coupled to an electrode that is coupled to a power supply voltage node VDD. The gate of the driving transistor DX may be electrically coupled to the conductive line 40. Accordingly, the gate of the driving transistor DX, an impurity region of the conversion gain transistor DCGX, and the source of the reset transistor RX may be electrically coupled to the first sub-floating diffusion FD11 and the second sub-floating diffusion FD12 through the conductive line 40. Furthermore, the source of the selection transistor SX may be electrically coupled to the column line (e.g., column line illustrated in FIG. 1).

Figure 3:
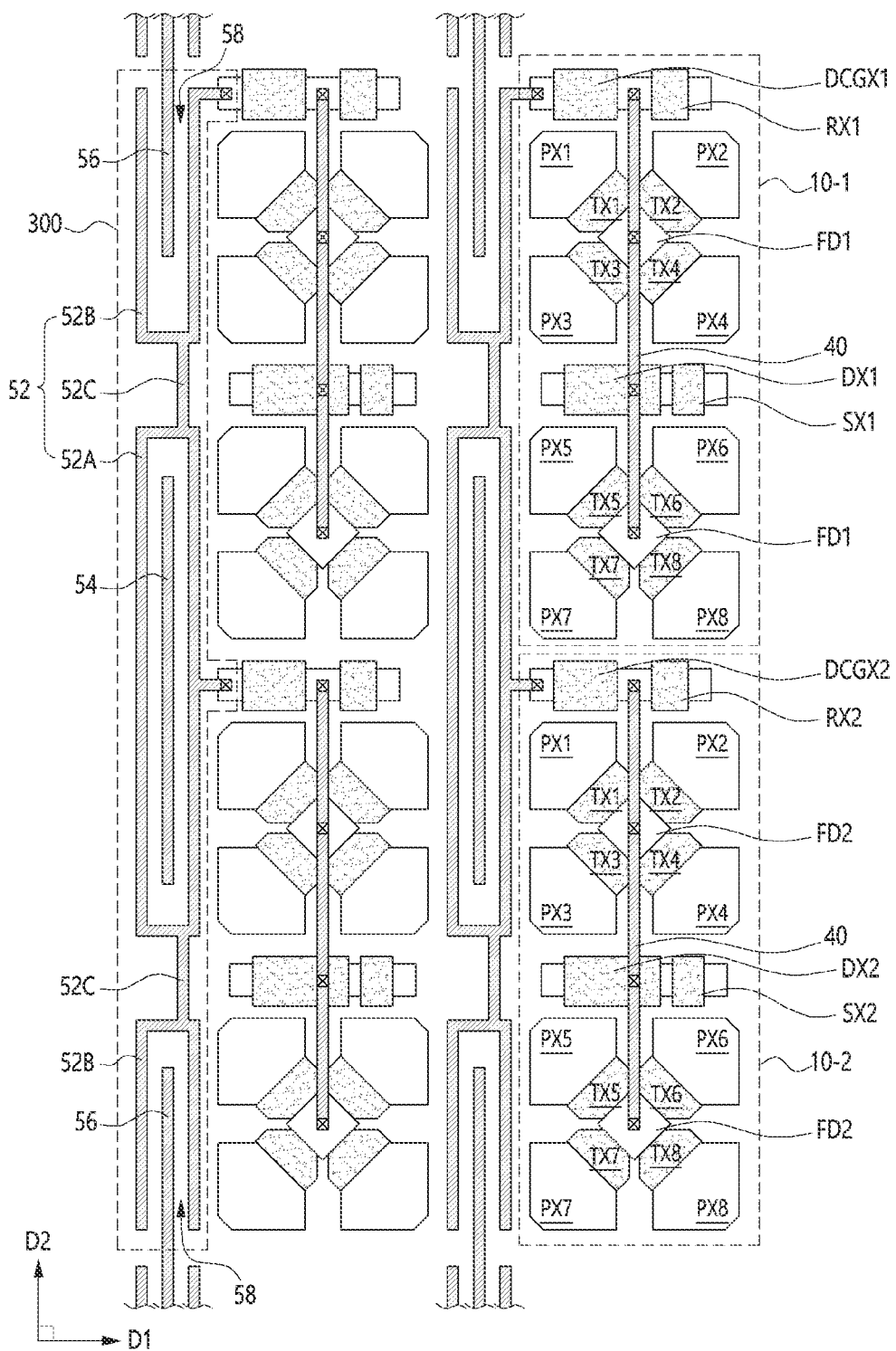
FIG. 3 illustrates a part of a pixel array of the image sensing device based on some embodiments of the disclosed technology.
Figure 4:
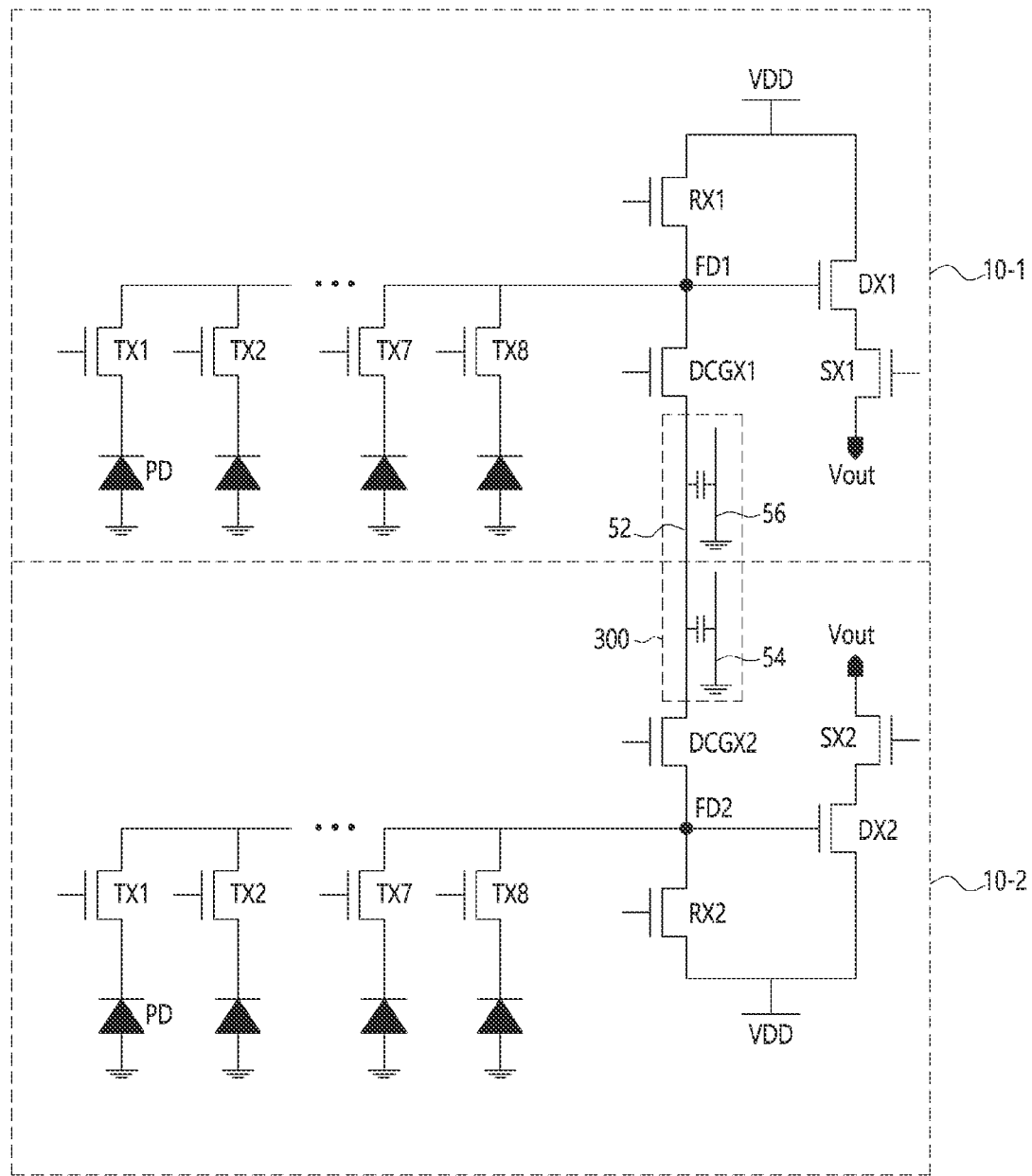
FIG. 4 illustrates a first pixel group, a second pixel group and a conversion gain capacitor illustrated in FIG. 3 based on some embodiments of the disclosed technology.

FIG. 3 illustrates a part of the pixel array of the image sensing device based on some embodiments of the disclosed technology. FIG. 4 illustrates a first pixel group, a second pixel group and a conversion gain capacitor illustrated in FIG. 3 based on some embodiments of the disclosed technology.

As illustrated in FIGS. 2 to 4, in the pixel array 110 based on some embodiments, the plurality of pixel groups 10 may be arranged in a matrix array. In each of the plurality of pixel groups 10, the first unit pixel PX1 to the eighth unit pixel PX8 may be arranged in a 2×4 matrix array.

In some implementations, the pixel array 110 may include a first pixel group 10-1 and a second pixel group 10-2 which are aligned in the second direction D2 and disposed adjacent to each other. The plurality of unit pixels PX1 to PX8 included in the first pixel group 10-1 may share a first floating diffusion FD1, and may include a first conversion gain transistor DCGX1 electrically coupled to the first floating diffusion FD1. Likewise, the plurality of unit pixels PX1 to PX8 included in the second pixel group 10-2 may share a second floating diffusion FD2, and may include a second conversion gain transistor DCGX2 electrically coupled to the second floating diffusion FD2. The first floating diffusion FD1 and the second floating diffusion FD2 may include the first sub-floating diffusion FD11 and the second sub-floating diffusion FD12 electrically coupled through the conductive line 40, respectively (see also FIG. 2).

The first pixel group 10-1 may include a first reset transistor RX1, the first conversion gain transistor DCGX1, a first driving transistor DX1, and a first selection transistor SX1. The first reset transistor RX1 may electrically couple its electrode that is coupled to a power supply voltage node VDD to the first floating diffusion FD1 in response to a first reset signal. The first conversion gain transistor DCGX1 may electrically couple a conversion gain capacitor 300 to the first floating diffusion FD1 in response to a first conversion gain signal. The first driving transistor DX1 may have a gate electrode that is electrically coupled to the first floating diffusion FD1, and may generate output signals corresponding to the respective unit pixels PX1 to PX8 that share the first floating diffusion FD1. Furthermore, the first selection transistor SX1 may transmit, to the column line (e.g., column line shown in FIG. 1), the output signals generated by the first driving transistor DX1 in response to a first selection signal.

The second pixel group 10-2 may include a second reset transistor RX2, the second conversion gain transistor DCGX2, a second driving transistor DX2, and a second selection transistor SX2. The second reset transistor RX2 may electrically couple its electrode that is coupled to a power supply voltage node VDD to the second floating diffusion FD2 in response to a second reset signal. The second conversion gain transistor DCGX2 may electrically couple the conversion gain capacitor 300 to the second floating diffusion FD2 in response to a second conversion gain signal. The second driving transistor DX2 may have a gate electrode that is electrically coupled to the second floating diffusion FD2, and may generate output signals corresponding to the respective unit pixels PX1 to PX8 that share the second floating diffusion FD2. Furthermore, the second selection transistor SX2 may transmit, to the column line (e.g., column line shown in FIG. 1), the output signals generated by the second driving transistor DX2 in response to a second selection signal. For reference, the first selection transistor SX1 of the first pixel group 10-1 and the second selection transistor SX2 of the second pixel group 10-2 may be electrically coupled to the same column line (e.g., column line shown in FIG. 1).

The first conversion gain transistor DCGX1 and the second conversion gain transistor DCGX2 may be electrically coupled to each other through the conversion gain capacitor 300 having a predetermined capacitance. The conversion gain capacitor 300 may include a plurality of conductive lines, such as a first conductive line 52, a second conductive line 54, and a third conductive line 56. The first, second, and third conductive lines 52, 54, and 56 may be formed in an interconnect wiring layer disposed on the gates of the first conversion gain transistor DCGX1 and the second conversion gain transistor DCGX2, and may be electrically coupled through a contact plug. For example, the first, second, and third conductive lines 52, 54, and 56 may be formed in the same layer as the conductive line 40.

In some implementations, the first conversion gain transistor DCGX1 and the second conversion gain transistor DCGX2 may be electrically coupled through the first conductive line 52. In one example, an impurity region of the first conversion gain transistor DCGX1 and an impurity region of the second conversion gain transistor DCGX2 may be electrically coupled to each other through the first conductive line 52. The first conductive line 52 may include a first region 52A having a ring type shape or rectangular shape and a second region 52B having a bracket type shape including an open end 58. In this case, the second region 52B may have "U" shape. The first conductive line 52 may further include a third region 52C coupling the first region 52A to the second region 52B. The third region 52C may be structured to extend between the first region 52A and the second region 52B.

In some implementations, the conversion gain capacitor 300 includes second regions 52B, a first region 52A arranged between the second regions 52B in the second direction D2, and third regions 52C structured to connect the second regions 52B to the first region 52A. In one example, the second regions 52B of the first conductive line 52 may be connected to both ends of the first region 52A in the second direction D2. As another example, the second region 52B of the first conductive line 52 may be connected to only one end of the first region 52A. The open end 58 of the second region 52B may be disposed to face another pixel group (not illustrated) adjacent to the first pixel group 10-1 and the second pixel group 10-2, and thus does not face the first region 52A.

In the conversion gain capacitor 300, the second conductive line 54 may be disposed within the first region 52A of the first conductive line 52. That is, the first region 52A of the first conductive line 52 may have a shape surrounding the second conductive line 54. In some implementations, the second conductive line 54 may be structured to be coupled to a ground voltage node. In some implementations, the conversion gain capacitor 300 may have a fixed capacitance value.

As another example, when the first conversion gain transistor DCGX1 or/and the second conversion gain transistor DCGX2 is/are activated, the second conductive line 54 may be configured to be supplied with a first boosting voltage. In this case, the conversion gain capacitor 300 may have a variable capacitance value, and can more effectively adjust the sensitivity of the image sensing device in a high illumination environment.

In the conversion gain capacitor 300, the third conductive line 56 may be disposed within the second region 52B of the first conductive line 52. In this case, the third conductive line 56 may have a shape extending to the outside of the second region 52B through the open end 58 of the second region 52B. Accordingly, two conversion gain capacitors 300 adjacent to each other may share the third conductive line 56. Like the second conductive line 54, the third conductive line 56 may be coupled to the ground voltage node. In this case, the conversion gain capacitor 300 may have a fixed capacitance value.

As another example, when the first conversion gain transistor DCGX1 or/and the second conversion gain transistor DCGX2 is/are activated, the third conductive line 56 may be configured to be supplied with a second boosting voltage. In this case, the conversion gain capacitor 300 may have a variable capacitance value, and can more effectively adjust the sensitivity of the image sensing device in a high illumination environment. In this case, the first boosting voltage applied to the second conductive line 54 and the second boosting voltage applied to the third conductive line 56 may be boosting voltages having the same polarity and magnitude. Furthermore, the first boosting voltage applied to the second conductive line 54 and the second boosting voltage applied to the third conductive line 56 may be boosting voltages having the same polarity while having different magnitudes. The sensitivity of the image sensing device can be even more effectively adjusted depending on whether the first boosting voltage and the second boosting voltage are applied and the magnitude of each of the first boosting voltage and the second boosting voltage.

As described above, in the pixel array 110 based on some embodiments of the disclosed technology, the first floating diffusion FD1 and the second floating diffusion FD2 are electrically coupled to the first reset transistor RX1 and the second reset transistor RX2, respectively, and independently operate by receiving reset signals, respectively. The first conversion gain transistor DCGX1 and the second conversion gain transistor DCGX2 are coupled in parallel to the first reset transistor RX1 and the second reset transistor RX2, respectively. Accordingly, a reset operation of resetting each of the first floating diffusion FD1 and the second floating diffusion FD2 can be smoothly performed as shown in FIGS. 4 and 5a to 5c. In this case, the source of the first reset transistor RX1 and the source of the first conversion gain transistor DCGX1 are coupled to the first floating diffusion FD1. An impurity region of the first reset transistor RX1 and an impurity region of the first conversion gain transistor DCGX1 are coupled to an electrode that is coupled to a power supply voltage node VDD. Accordingly, the first reset transistor RX1 and the first conversion gain transistor DCGX1 may be coupled in parallel. In this case, an impurity region of the first conversion gain transistor DCGX1 may be coupled to an electrode that is coupled to a power supply voltage node VDD through the second conversion gain transistor DCGX2 and the second reset transistor RX2.

Furthermore, the pixel array 110 based on some embodiments of the disclosed technology may include the conversion gain capacitor 300 electrically coupling the first conversion gain transistor DCGX1 to the second conversion gain transistor DCGX2, thus easily adjusting the sensitivity of an image sensor. In particular, the pixel array 110 can obtain high-quality images in a high illumination environment by providing a capacitance that is larger than the capacitance of a single floating diffusion FD (e.g., more than four times the capacitance of a single floating diffusion FD).

For reference, it is difficult for each of the pixel groups 10 to have a plurality of conversion gain transistors DCGX due to its limited area. Accordingly, there is a limit to increase the capacitance of the floating diffusion FD by electrically coupling one conversion gain transistor DCGX to the floating diffusion FD while the conversion gain transistor DCGX is deactivated.

However, the image sensing device implemented based on some embodiments of the disclosed technology can obtain high-quality images, when a high conversion gain is required to obtain an image of an object in a low illumination environment, by deactivating both the first conversion gain transistor DCGX1 and the second conversion gain transistor DCGX2 to only use the capacitance of the floating diffusion FD of each pixel group 10. In contrast, when a low conversion gain is required to obtain an image of an object in a high illumination environment, a high-quality image can be obtained by activating both the first conversion gain transistor DCGX1 and the second conversion gain transistor DCGX2 to use the capacitance of the conversion gain capacitor 300 along with the capacitance of each of the first floating diffusion FD1 and the second floating diffusion FD2, increasing the capacitance of the floating diffusion FD.

Although FIG. 3 illustrates the first pixel group 10-1 and the second pixel group 10-2 as being aligned in the second direction D2, the first pixel group 10-1 and the second pixel group 10-2 may be aligned in the first direction D1 in other implementations.

Figure 5A:
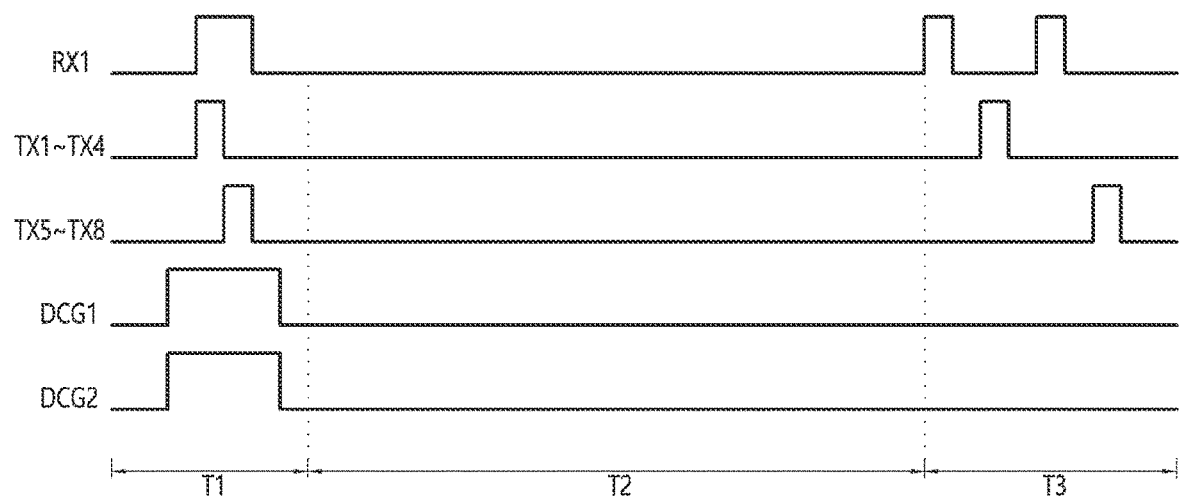
FIGS. 5a to 5c are timing diagrams for describing operating methods of the image sensing device based on some embodiments of the disclosed technology.
Figure 5B:
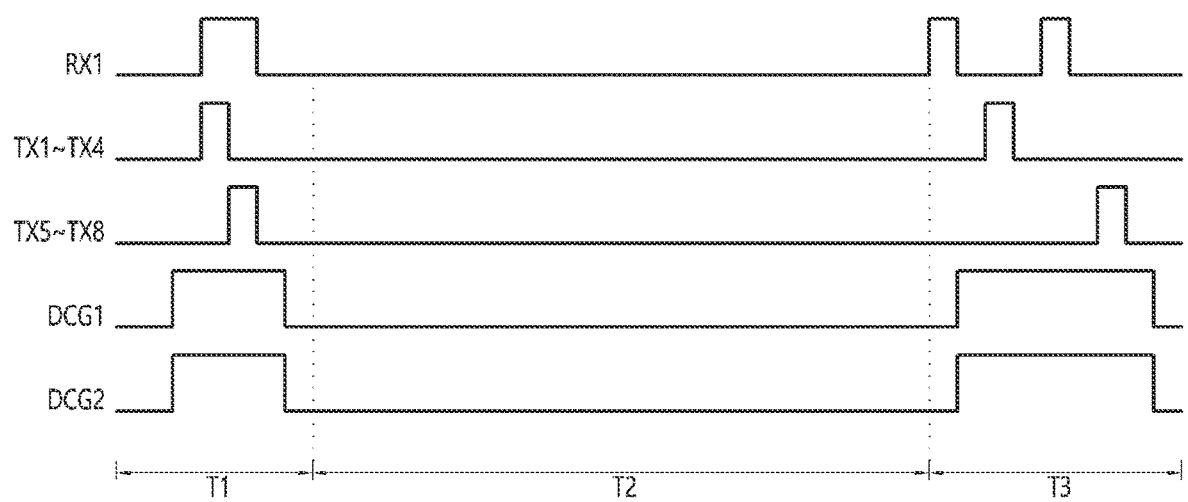
Figure 5C:
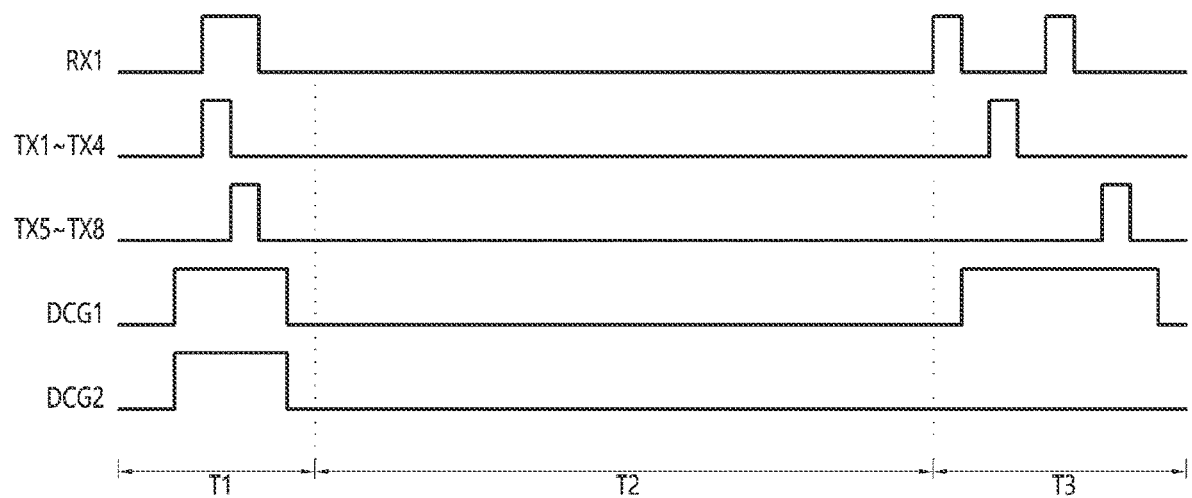

FIGS. 5a to 5c are timing diagrams for describing operating methods of the image sensing device based on some embodiments of the disclosed technology. Hereinafter, a 4SUM operation mode in which four unit-pixels simultaneously operate will be described as an example, for convenience of description. Furthermore, an operation of the first pixel group 10-1 will be discussed below as an example.

As illustrated in FIGS. 4 and 5a, in the case of a low illumination environment or a general mode of the image sensing device, a high conversion gain may be required to obtain the image of an object because the sensitivity increases as the sum of capacitance of the first floating diffusion FD1 decreases. For this reason, the first conversion gain transistor DCGX1 and the second conversion gain transistor DCGX2 may be deactivated in a third period T3 in which electrical charges generated from the plurality of unit pixels are transmitted to the first floating diffusion FD1.

For reference, a first period T1 is a period in which a reset operation for resetting the first floating diffusion FD1 is performed. In the first period T1, both the first conversion gain transistor DCGX1 and the second conversion gain transistor DCGX2 may be activated. A second period T2 may be a period corresponding to an integration time when each of the plurality of unit pixels generates electrical charges in response to incident light.

As illustrated in FIGS. 4 and 5b, in the case of a high illumination environment or a high dynamic range (HDR) mode of the image sensing device, a low conversion gain may be required to obtain the image of an object because the sensitivity decreases as the sum of capacitance of the first floating diffusion FD1 increases. For this reason, both the first conversion gain transistor DCGX1 and the second conversion gain transistor DCGX2 may be activated in the third period T3 in which electrical charges generated by the plurality of unit pixels are transmitted to the first floating diffusion FD1.

As illustrated in FIGS. 4 and 5c, if a lower conversion gain is required compared to a low illumination environment and a higher conversion gain is required compared to a high illumination environment, the first conversion gain transistor DCGX1 may be activated and the second conversion gain transistor DCGX2 may be deactivated in the third period T3.

As described above, the image sensing device implemented based on some embodiments of the disclosed technology can easily adjust the sensitivity of an image sensor by including the conversion gain capacitor 300 electrically coupling the first conversion gain transistor DCGX1 of the first pixel group 10-1 to the second conversion gain transistor DCGX2 of the second pixel group 10-2.

Figure 6:
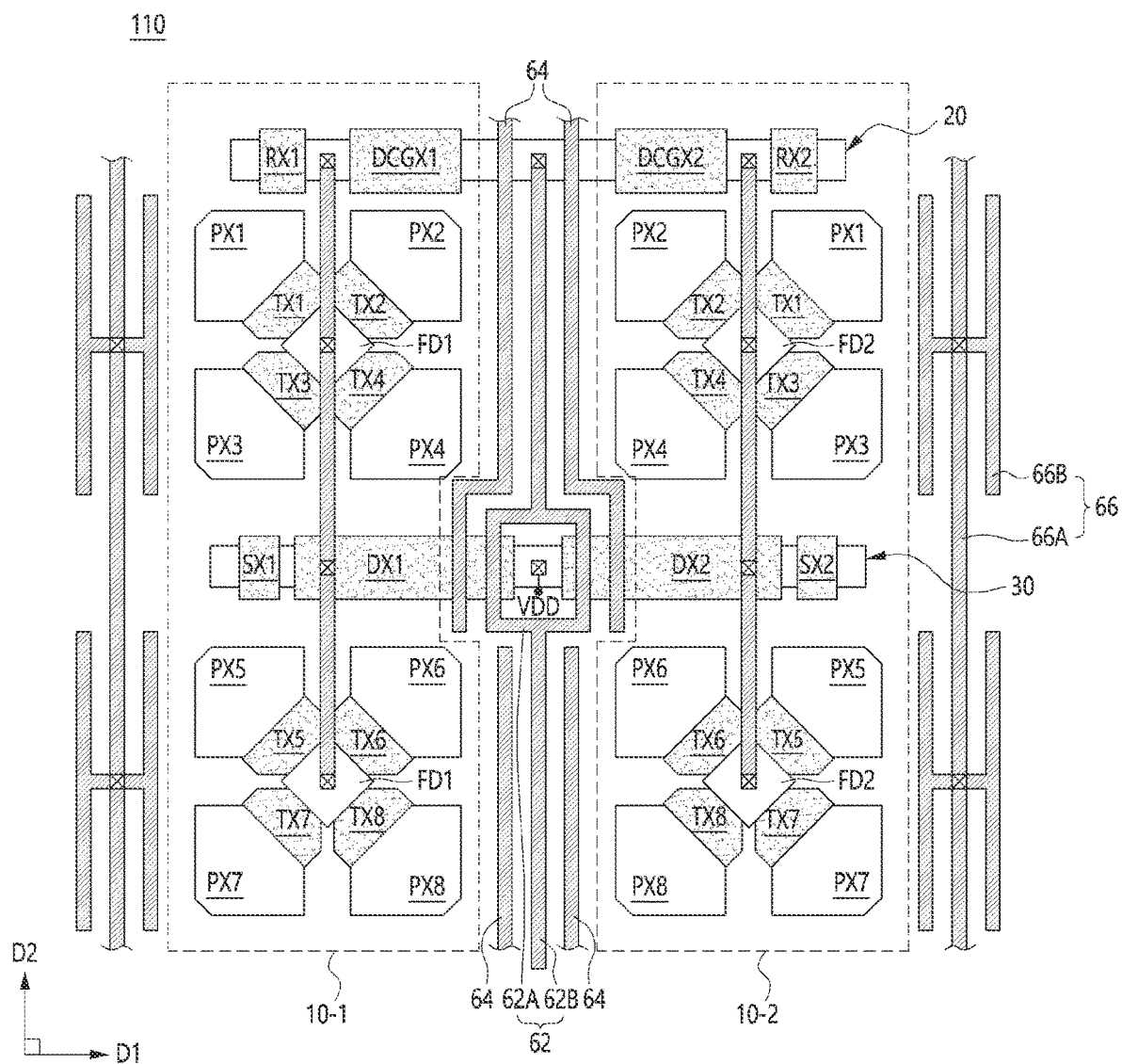
FIG. 6 illustrates a part of a pixel array of an image sensing device based on some embodiments of the disclosed technology.

FIG. 6 illustrates a part of a pixel array of an image sensing device based on some embodiments of the disclosed technology. In FIG. 6, the elements labeled with the same reference numerals as FIGS. 3 and 4, such as a first pixel group, a second pixel group, and a conversion gain capacitor, may have the same structures as those illustrated in FIGS. 3 and 4.

As illustrated in FIG. 6, in a pixel array 110 based on some embodiments, a plurality of pixel groups 10 may be arranged as a matrix structure. In each of the plurality of pixel groups 10, a first unit pixel PX1 to an eighth unit pixel PX8 may be arranged in a 2×4 matrix array. Specifically, the pixel array 110 may include a first pixel group 10-1 and a second pixel group 10-2 disposed adjacent to each other. In this case, the first pixel group 10-1 and the second pixel group 10-2 may have a symmetrical in the first direction D1.

The first pixel group 10-1 may include the plurality of unit pixels PX1 to PX8 sharing a first floating diffusion FD1, a first reset transistor RX1 electrically coupling its electrode that is coupled to a power supply voltage node VDD to the first floating diffusion FD1 in response to a first reset signal, a first conversion gain transistor DCGX1 electrically coupling a conversion gain capacitor 300 to the first floating diffusion FD1 in response to a first conversion gain signal, a first driving transistor DX1 generating output signals corresponding to the respective unit pixels PX1 to PX8 that share the first floating diffusion FD1, and a first selection transistor SX1 transmitting, to a column line, the output signals generated by the first driving transistor DX1 in response to a first selection signal.

The second pixel group 10-2 may include the plurality of unit pixels PX1 to PX8 sharing a second floating diffusion FD2, a second reset transistor RX2 electrically coupling its electrode that is coupled to a power supply voltage node VDD to the second floating diffusion FD2 in response to a second reset signal, a second conversion gain transistor DCGX2 electrically coupling the conversion gain capacitor 300 and the second floating diffusion FD2 in response to a second conversion gain signal, a second driving transistor DX2 generating output signals corresponding to the respective unit pixels PX1 to PX8 that share the second floating diffusion FD2, and a second selection transistor SX2 transmitting, to a column line, the output signals generated by the second driving transistor DX2 in response to a second selection signal. For reference, the first selection transistor SX1 of the first pixel group 10-1 and the second selection transistor SX2 of the second pixel group 10-2 may be electrically coupled to different column lines.

The first reset transistor RX1 and first conversion gain transistor DCGX1 of the first pixel group 10-1, together with the second reset transistor RX2 and second conversion gain transistor DCGX2 of the second pixel group 10-2, may share a first active region 20. In this case, the first conversion gain transistor DCGX1 and the second conversion gain transistor DCGX2 may be disposed adjacent to each other. Furthermore, the first driving transistor DX1 and first selection transistor SX1 of the first pixel group 10-1, together with the second driving transistor DX2 and second selection transistor SX2 of the second pixel group 10-2, may share one second active region 30. In this case, the first driving transistor DX1 and the second driving transistor DX2 may be disposed adjacent to each other. As described above, since the pixel transistors share the active region, the channel area of pixel transistors can be easily increased within a limited area, and a conductive line design difficulty can be reduced. Accordingly, the performance of the pixel transistor can be improved, and a signal transfer characteristic can be improved by reducing total resistance of the conductive line.

The first conversion gain transistor DCGX1 and the second conversion gain transistor DCGX2 may be electrically coupled through the conversion gain capacitor 300 having a predetermined capacitance. The conversion gain capacitor 300 may include a plurality of conductive lines, such as a first conductive line 62, a second conductive line 64, and a third conductive line 66. The first, second, and third conductive lines 62, 64, and 66 may be formed in an interconnect wiring layer disposed on the gates of the first conversion gain transistor DCGX1 and the second conversion gain transistor DCGX2, and may be electrically coupled through a contact plug. For example, the first, second, and third conductive lines 62, 64, and 66 may be formed in the same layer as a conductive line 40 (refer to FIG. 2).

In some implementations, the first conversion gain transistor DCGX1 and the second conversion gain transistor DCGX2 may be electrically coupled to the first conductive line 62. In one example, an impurity region of the first conversion gain transistor DCGX1 and an impurity region of the second conversion gain transistor DCGX2 may be electrically coupled to the first conductive line 62. The first conductive line 62 may be disposed between the first pixel group 10-1 and the second pixel group 10-2 in the first direction D1, and may extend in the second direction D2. In this case, the first conductive line 62 may have a length corresponding to a length of the first pixel group 10-1 and a length of the second pixel group 10-2 in the second direction D2. The first conductive line 62 may include a first region 62A having a ring type shape and a second region 62B having a line type shape elongating in the second direction D2 from the first region 62A.

The first region 62A of the first conductive line 62 having the ring type shape may be disposed in a middle part of the first conductive line 62 between second regions 62B aligned in the second direction D2, and may overlap a middle part of the second active region 30 shared by the first driving transistor DX1 and the second driving transistor DX2. In some implementations, a contact plug may penetrate the first region 62A of the first conductive line 62 having the ring type shape to electrically couple a power supply voltage node VDD, and an impurity region of the first driving transistor DX1 and an impurity region of the second driving transistor DX2. The second regions 62B of the first conductive line 62 each having a line type shape may be connected to the first region 62A in the second direction D2, respectively. The second regions 62B connected to the first region 62A in the second direction D2 may be aligned with each other. Ends on one side of the second regions 62B of the first conductive line 62 may be electrically coupled, through the contact plug, to the first active region 20 and used as an impurity region of the first conversion gain transistor DCGX1 and an impurity region of the second conversion gain transistor DCGX2.

In the conversion gain capacitor 300, the second conductive lines 64 may be disposed on both sides of the first conductive line 62. In some implementations, the second conductive line 64 may include discontinuous conductive lines extending in the second direction D2 along a profile of the first conductive line 62, but are disconnected in the first region 62A of the first conductive line 62. The second conductive line 64 may be configured to be coupled to a ground voltage node. In this case, the conversion gain capacitor 300 may have a fixed capacitance value.

In the conversion gain capacitor 300, the third conductive line 66 may be disposed on each of the other side of the first pixel group 10-1 and one side of the second pixel group 10-2 in the first direction D1. That is, the third conductive lines 66 may be disposed on both sides of the first conductive line 62. The first pixel group 10-1, the first conductive line 62, the second conductive line 64, and the second pixel group 10-2 may be disposed between the third conductive lines 66. Like the second conductive line 64, the third conductive line 66 may be coupled to the ground voltage node. The third conductive line 66 may be used to enable the conversion gain capacitor 300 to have a stable and even capacitance value. To this end, the third conductive line 66 may include a third region 66A extending in the second direction and fourth regions 66B electrically coupled to the third region 66A, disposed adjacent to the unit pixels, and each having an "H" plane shape. The fourth regions 66B may have a symmetrical shape with respect to the third region 66A.

As described above, in the pixel array 110 based on some embodiments of the disclosed technology, the first floating diffusion FD1 and the second floating diffusion FD2 are electrically coupled to the first reset transistor RX1 and the second reset transistor RX2, respectively, and independently operate by receiving reset signals, respectively. The first conversion gain transistor DCGX1 and the second conversion gain transistor DCGX2 are coupled in parallel to the first reset transistor RX1 and the second reset transistor RX2, respectively. Accordingly, a reset operation of resetting each of the first floating diffusion FD1 and the second floating diffusion FD2 can be smoothly performed (as shown in FIGS. 4 and 5a to 5c).

Furthermore, the pixel array 110 based on some embodiments of the disclosed technology can easily adjust the sensitivity of an image sensor by including the conversion gain capacitor 300 that electrically couples the first conversion gain transistor DCGX1 to the second conversion gain transistor DCGX2 to obtain a high-quality image in a high illumination environment by providing a capacitance that is larger than the capacitance of a single floating diffusion FD (e.g., more than four times the capacitance of a single floating diffusion FD).

Figure 7:
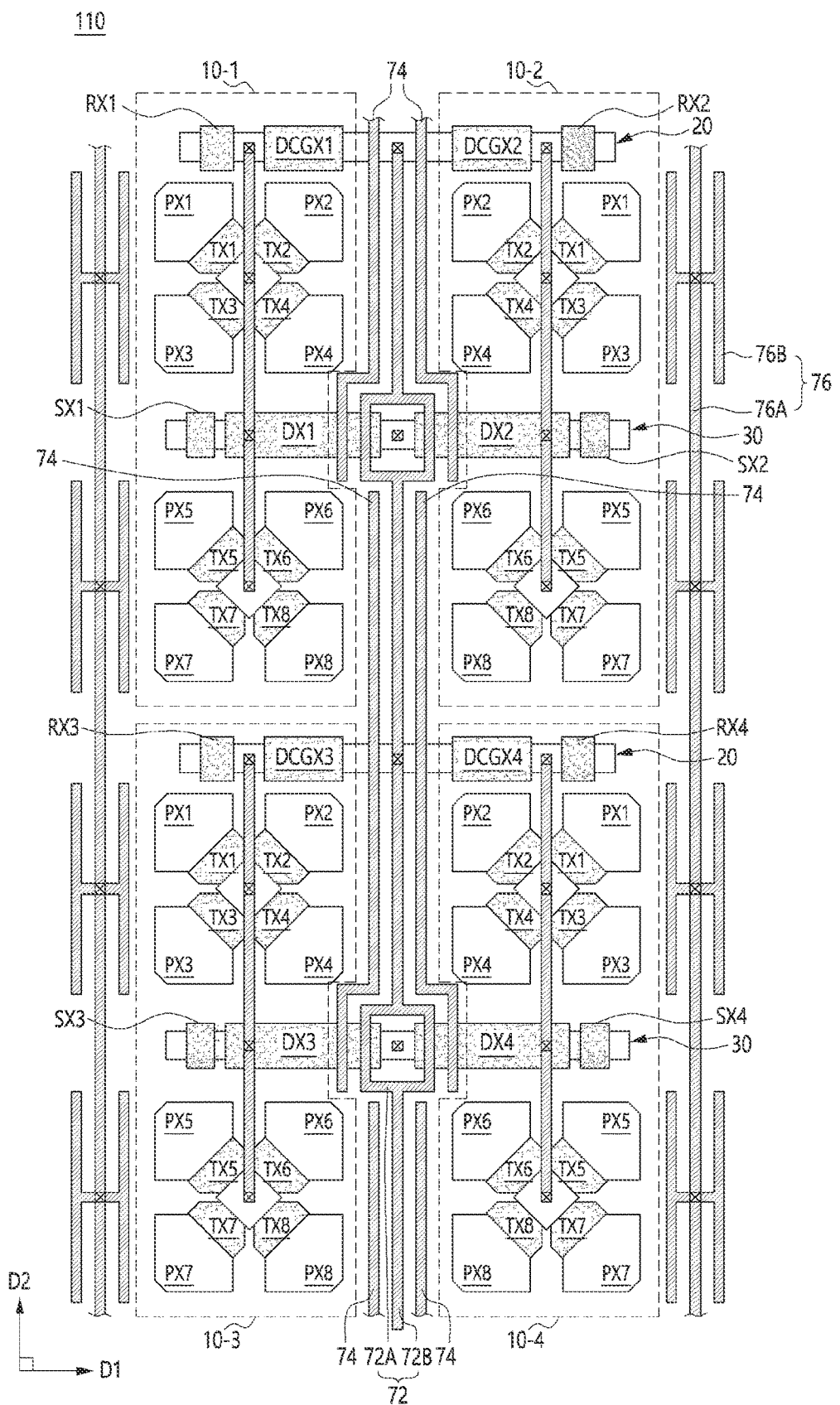
FIG. 7 illustrates a part of a pixel array of an image sensing device based on some embodiments of the disclosed technology.

FIG. 7 illustrates a part of a pixel array of an image sensing device based on some embodiments of the disclosed technology. In FIG. 7, the elements labeled with the same reference numerals as FIGS. 3 and 6 may have the same structures as those illustrated in FIGS. 3 and 6.

In some embodiments of the disclosed technology, the image sensing device in which the conversion gain capacitor can provide a capacitance that is larger than the capacitance of a single floating diffusion FD by electrically coupling two conversion gain transistors.

As illustrated in FIG. 7, in the pixel array 110 based on some embodiments, the conversion gain capacitor 300 illustrated in FIG. 6 may be expanded in the second direction D2 to electrically couple the first conversion gain transistor DCGX1 to the fourth conversion gain transistor DCGX4, and thus can provide a capacitance that is larger than the capacitance of a single floating diffusion FD (e.g., more than eight times the capacitance of a single floating diffusion FD).

Only limited examples of implementations or embodiments of the disclosed technology are described or illustrated. Variations and enhancements for the disclosed implementations or embodiments and other implementations or embodiments are possible based on what is disclosed and illustrated in this patent document.

What is claimed is:

1. An image sensing device comprising:
   a first pixel group including a plurality of first image sensing pixels structured to convert light into electrical charges and a first conversion gain transistor coupled to the plurality of first image sensing pixels;
   a second pixel group including a plurality of second image sensing pixels structured to convert light into electrical charges and a second conversion gain transistor coupled to the plurality of second image sensing pixels, the second pixel group disposed adjacent to the first pixel group; and
   a conversion gain capacitor structured to electrically couple the first conversion gain transistor to the second conversion gain transistor to provide a capacitance to the first and second image sensing pixels,
   wherein the conversion gain capacitor comprises a first conductive line structured to include a region having a ring type shape and a second conductive line disposed adjacent to the first conductive line.

2. The image sensing device according to claim 1, wherein:
   the first pixel group further comprises a first floating diffusion region shared by the plurality of first image sensing pixels and a first reset transistor structured to selectively couple a power supply voltage node to the first floating diffusion region; and
   the second pixel group further comprises a second floating diffusion region shared by the plurality of second image sensing pixels and a second reset transistor structured to selectively couple the power supply voltage node to the second floating diffusion region.

3. The image sensing device according to claim 2, wherein:
the first conversion gain transistor is structured to selectively couple the conversion gain capacitor to the first floating diffusion region; and
the second conversion gain transistor is structured to selectively couple the conversion gain capacitor to the second floating diffusion region.

4. The image sensing device according to claim 2, wherein:
the first conversion gain transistor is coupled in parallel to the first reset transistor in the first pixel group; and
the second conversion gain transistor is coupled in parallel to the second reset transistor in the second pixel group.

5. The image sensing device according to claim 1, wherein:
the first conductive line is structured to electrically couple the first conversion gain transistor to the second conversion gain transistor, and
the second conductive line is disposed within the region having a ring type and surrounded by the first conductive line.

6. The image sensing device according to claim 1, wherein:
the first conductive line is electrically coupled to the first conversion gain transistor and the second conversion gain transistor; and
the second conductive lines are disposed on both sides of the first conductive line and extend along a profile of the first conductive line, and comprise discontinuous conductive lines in the region having a ring type plane shape.

7. The image sensing device according to claim 1, wherein the second conductive line is configured to be coupled to a ground voltage node.

8. An image sensing device comprising:
a first pixel group including a plurality of first image sensing pixels structured to convert light into electrical charges and a first conversion gain transistor coupled to the plurality of first image sensing pixels;
a second pixel group including a plurality of second image sensing pixels structured to convert light into electrical charges and a second conversion gain transistor disposed adjacent to and coupled to the plurality of second image sensing pixels, the second pixel group aligned with the first pixel group in a second direction; and
a conversion gain capacitor disposed on one side of the first pixel group and the second pixel group in a first direction intersecting the second direction and structured to electrically couple the first conversion gain transistor to the second conversion gain transistor to provide a capacitance to the first and second image sensing pixels,
wherein the conversion gain capacitor comprises:
a first conductive line structured to electrically couple the first conversion gain transistor to the second conversion gain transistor and include a first region having a rectangle type shape that is closed and a second region having a rectangle type shape that includes an open portion at one end thereof; and
a second conductive line formed within the first region of the first conductive line.

9. The image sensing device according to claim 8, further comprising a third conductive line formed within the second region of the first conductive line.

10. The image sensing device according to claim 9, wherein:
the third conductive line is structured to include a shape extending to an outside of the second region through the open portion of the second region in the second direction; and
two conversion gain capacitors adjacent to each other are structured to share the third conductive line.

11. The image sensing device according to claim 9, wherein each of the second conductive line and the third conductive line is configured to be coupled to a ground voltage node.

12. The image sensing device according to claim 8, wherein, in the second direction, the second regions of the first conductive line are disposed on both sides of the first region, and the open portion of the second region of the first conductive line is disposed not to face the first region.

13. The image sensing device according to claim 8, wherein:
the first pixel group and the second pixel group further comprise a first selection transistor and a second selection transistor, respectively; and
the first selection transistor and the second selection transistor are electrically coupled to a column line in common.

14. The image sensing device according to claim 8, wherein:
the first pixel group further comprises a first floating diffusion region shared by the plurality of first image sensing pixels and a first reset transistor structured to selectively couple a power supply voltage node to the first floating diffusion region,
the second pixel group further comprises a second floating diffusion region shared by the plurality of second image sensing pixels and a second reset transistor structured to selectively couple the power supply voltage node to the second floating diffusion region.

15. The image sensing device according to claim 14, wherein:
the first conversion gain transistor is structured to selectively couple the conversion gain capacitor and the first floating diffusion region, and
the second conversion gain transistor is structured to selectively couple the conversion gain capacitor to the second floating diffusion region.

16. An image sensing device comprising:
a first pixel group including a plurality of first image sensing pixels structured to convert light into electrical charges and a first conversion gain transistor coupled to the plurality of first image sensing pixels;
a second pixel group including a plurality of second image sensing pixels structured to convert light into electrical charges and a second conversion gain transistor disposed adjacent to and coupled to the plurality of second image sensing pixels, the second pixel group aligned with the first pixel group in a first direction; and
a conversion gain capacitor disposed between the first pixel group and the second pixel group in the first direction and structured to electrically couple the first conversion gain transistor to the second conversion gain transistor to provide a capacitance to the first and second image sensing pixels,
wherein the conversion gain capacitor comprises:
a first conductive line structured to extend in a second direction intersecting the first direction and electrically coupled to the first conversion gain transistor and the second conversion gain transistor, the first conductive line comprising a first region having a ring type plane shape and a second region having a line type plane shape; and second conductive lines elongated in the second direction and disposed on both sides of the first conductive line.

17. The image sensing device according to claim 16, further comprising a third pixel group and a fourth pixel group aligned with the first pixel group and the second pixel group, respectively, in the second direction and comprising a third conversion gain transistor and a fourth conversion gain transistor, respectively, wherein the conversion gain capacitor elongates in the second direction and electrically couples the first conversion gain transistor to the fourth conversion gain transistor.

18. The image sensing device according to claim 16, further comprising a third conductive line disposed on another side of the first pixel group and one side of the second pixel group in the first direction and extending in the second direction.

19. The image sensing device according to claim 18, wherein:

the third conductive line comprises a third region having a line type shape extending in the second direction and fourth regions electrically coupled to the third region and each having an H shape, wherein the fourth regions have a symmetrical shape with respect to the third region.

20. The image sensing device according to claim 19, wherein each of the second conductive line and the third conductive line is configured to be coupled to a ground voltage node.

21. The image sensing device according to claim 16, wherein the first pixel group and the second pixel group have a symmetrical shape in the first direction.

22. The image sensing device according to claim 16, wherein:

the first region of the first conductive line is disposed in a middle part of the first pixel group and the second pixel group in the second direction, and the second regions of the first conductive line are disposed over and under the first region, respectively, and aligned with each other; and a contact plug penetrates the first region of the first conductive line.

23. The image sensing device according to claim 16, wherein the second conductive line comprises discontinuous conductive lines extending along a profile of the first conductive line and disconnected in the first region of the first conductive line.

24. The image sensing device according to claim 16, wherein:

the first pixel group and the second pixel group further comprise a first selection transistor and a second selection transistor, respectively; and the first selection transistor and the second selection transistor are electrically coupled to different column lines.

25. The image sensing device according to claim 16, wherein:

the first pixel group further comprises a first floating diffusion region shared by the plurality of first image sensing pixels and a first reset transistor structured to selectively couple a power supply voltage node to the first floating diffusion region, and the second pixel group further comprises a second floating diffusion region shared by the plurality of second image sensing pixels and a second reset transistor structured to selectively couple the power supply voltage node to the second floating diffusion region.

26. The image sensing device according to claim 25, wherein:

the first conversion gain transistor is structured to selectively couple the conversion gain capacitor to the first floating diffusion region; and the second conversion gain transistor is structured to selectively couple the conversion gain capacitor to the second floating diffusion region.

\* \* \* \* \*